United States Patent
Hashimoto et al.

(10) Patent No.: US 6,433,309 B2
(45) Date of Patent: Aug. 13, 2002

(54) OSCILLATOR THAT USES THERMOSTATIC OVEN

(75) Inventors: Hideo Hashimoto; Takeshi Uchida, both of Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/795,104

(22) Filed: Mar. 1, 2001

(30) Foreign Application Priority Data

Mar. 2, 2000 (JP) ........................................ 2000-057549

(51) Int. Cl.[7] ................................................. H05B 1/00
(52) U.S. Cl. ............................................ 219/210; 330/10
(58) Field of Search ................................. 219/210, 494; 330/110; 331/17; 358/22; 364/484

(56) References Cited

U.S. PATENT DOCUMENTS

| | | | |
|---|---|---|---|
| 3,725,644 A | * 4/1973 | Bailey | 219/494 |
| 3,838,248 A | * 9/1974 | Uchida et al. | 219/210 |
| 3,970,818 A | * 7/1976 | Fridrichs | 219/210 |
| 4,053,733 A | * 10/1977 | Murata et al. | 219/494 |
| 4,672,180 A | * 6/1987 | Kusunoki et al. | 219/494 |
| 5,153,712 A | * 10/1992 | Masaike | 358/22 |
| 5,210,503 A | * 5/1993 | Sawamura | 330/110 |
| 5,629,649 A | * 5/1997 | Ujiie | 331/17 |
| 5,719,782 A | * 2/1998 | Mitsuoka | 364/484 |

FOREIGN PATENT DOCUMENTS

| | | | | |
|---|---|---|---|---|
| JP | 355078604 | * | 6/1980 | ............ H03B/5/32 |
| JP | 359194519 | * | 11/1984 | ............ H03B/5/32 |
| JP | 359205803 | * | 11/1984 | ............ H03B/5/32 |
| JP | 01248806 | * | 10/1989 | ............ H03B/5/32 |
| JP | 407050523 | * | 2/1995 | ............ H03B/5/32 |
| JP | 409098022 | * | 4/1997 | ............ H03B/5/32 |
| JP | 411136036 | * | 5/1999 | ............ H03B/5/32 |

* cited by examiner

*Primary Examiner*—Teresa Walberg
*Assistant Examiner*—Leonid M Fastovsky
(74) *Attorney, Agent, or Firm*—Oblon, Spivak, McClelland, Maier & Neustadt, P.C.

(57) ABSTRACT

An oven-controlled oscillator includes a thermostatic oven having a heat source, a vibrator provided in the thermostatic oven, an oscillation circuit for generating an oscillation signal in response to an action of the vibrator, and a heat source control circuit. The heat source control circuit includes a sensor for detecting an internal temperature of the thermostatic oven, an operational amplifier for controlling current to flow through the heat source in response to a resistance value of the sensor so that the internal temperature of the thermostatic oven may be maintained at a predetermined preset temperature, and a feedback resistor for the operational amplifier. The feedback resistor includes a thermistor whose resistance value drops as the temperature rises, and the thermistor is thermally coupled to the thermostatic oven. Preferably, a quartz-crystal element is used as the vibrator.

9 Claims, 5 Drawing Sheets

OSCILLATOR THAT USES THERMOSTATIC OVEN

BACKGROUND OF THE INVENTION

1. Technical Field to Which the Invention Pertains

This invention relates to an oscillator wherein a thermostatic oven is used to stabilize the oscillation frequency, and more particularly to a quartz-crystal oscillator wherein an operational amplifier is used to control a heat source of a thermostatic oven.

2. Background Art

From among oscillators which employ a quartz-crystal element, an oven-controlled oscillator wherein a vibrator such as a quartz-crystal element is held in a thermostatic oven has a stabilized oscillation frequency against a variation of the ambient temperature because an oscillation circuit operates with the quartz-crystal element or the like kept at a constant temperature. The oven-controlled oscillator is used particularly for applications for which a high frequency stability is required such as a comparatively high grade communication apparatus used in a base station of a mobile communication system, for example.

The oven-controlled oscillator usually includes a quartz-crystal element, a thermostatic oven which includes an electric heater and in which the quartz-crystal element is accommodated, and a heat source control circuit for controlling the heater of the thermostatic oven. FIG. 1 shows a general circuit configuration of a conventional oven-controlled oscillator.

The oven-controlled oscillator includes crystal oscillation circuit 10, thermostatic oven 1 in which quartz-crystal element 3 is accommodated, heater 6 for heating the inside of thermostatic oven 1, and heat source control circuit 2 for controlling heater 6. Heat source control circuit 2 includes thermistor RT1 thermally coupled to thermostatic oven 1 as hereinafter described, and the remaining part of heat source control circuit 2 except thermistor RT1 is referred to as control circuit unit 11. Crystal oscillation circuit 10 is an oscillation circuit that includes quartz-crystal element 3 as a circuit element. Crystal oscillation circuit 10 is a circuit of the Colpitts type, for example, wherein a resonance circuit is formed from quartz-crystal element 3 serving as an inductor component and series capacitors and part of an output of the resonance circuit is amplified and fed back to the resonance circuit by an amplifier (transistor) so that the circuit may oscillate.

As shown in FIG. 2, quartz-crystal element 3 is formed from a quartz blank of, for example, an AT cut enclosed in and held by metal vessel 5 from which a pair of leads 4 are led out. FIG. 3 illustrates a frequency-temperature characteristic of a quartz-crystal element which uses an AT cut quartz blank. As can be seen from FIG. 3, the AT cut quartz blank has such a frequency-temperature characteristic of a cubic curve that a point of inflection appears in the proximity of 25° C. of the room temperature and a minimal value of the frequency appears in the proximity of +70° C.

Thermostatic oven 1 is formed, as shown in FIG. 2 described above, from heater wire 6 serving as a heat source and wound around an outer wall of metal vessel 5 of quartz-crystal element 3. With thermostatic oven 1 having the configuration just described, metal vessel 5 is heated entirely by heater wire 6 and functions as a thermostatic oven for the quartz blank. According to circumstances, metal vessel 5 and heater wire 6 are insulated from the external air by means of a heat insulator or an adiabatic material (not shown). The internal temperature of thermostatic oven 1 is maintained constant by heat source control circuit 2. Heat source control circuit 2 detects the internal temperature of thermostatic oven 1 by means of a temperature sensitive element such as thermistor RT1 thermally coupled to thermostatic oven 1 and controls current to be supplied to heater 6 in response to a result of the detection to try to keep the internal temperature of thermostatic oven 1, that is, the temperature of quartz-crystal element 3, at a constant value. Thermistor RT1 is disposed in the proximity of heater wire 6, for example. The temperature of thermostatic oven 1 (quartz-crystal element 3) when such temperature control is performed is set to a temperature that indicates a frequency minimal value on the higher temperature side of the frequency-temperature characteristic of quartz-crystal element 3. This temperature is referred to as preset temperature.

FIG. 4 shows an example of particular circuit configuration of heat source control circuit 2. Heat source control circuit 2 includes operational amplifier 7 operating as an inverted differential amplifier. A reference voltage produced by dividing a voltage of power supply Vcc by dividing bias resistors R1, R2 is inputted to a non-inverted input terminal (+) of operational amplifier 7. A comparison voltage obtained from dividing bias resistors R3, R4 is inputted to an inverted input terminal (−) of operational amplifier 7 through resistor Ra. Here, thermistor RT1 serving as a temperature sensitive element is used as bias resistor R3 on power supply Vcc side. This thermistor RT1 has such a temperature-resistance characteristic that the resistance value decreases as the temperature rises as seen in FIG. 5. The output terminal and the inverted input terminal of operational amplifier 7 are connected to each other through feedback resistor Rb. In the present circuit, the amplification factor A of operational amplifier 7 is represented by Rb/Ra. The output of operational amplifier 7 is connected through resistor R5 to the base of transistor 8 whose emitter is grounded. Heater wire 6 of thermostatic oven 1 is connected between the collector of transistor 8 and power supply Vcc.

In the present circuit, various circuit constants are set so that the resistance value of thermistor RT1 at the room temperature of 25° C. is higher than that of resistor R4 and a great difference voltage may appear between the reference voltage which depends upon resistors R1, R2 and the comparison voltage which depends upon resistor R4 and thermistor RT1. Consequently, when power supply is made available, the great difference voltage is amplified in accordance with the amplification factor A of operational amplifier 7 and inputted to the base of transistor 8. Accordingly, high collector current flows to transistor 8 and a great amount of heat is generated from heater 6. Therefore, when power supply is made available, the internal temperature of thermostatic oven 1, i.e., the temperature of quartz-crystal element 3, rises suddenly.

As the internal temperature of thermostatic oven 1 rises, the resistance value of thermistor RT1 drops, and consequently, the comparison voltage decreases until it indicates a value near to the reference voltage. At this time, the internal temperature of thermostatic oven 1 reaches +70° C. corresponding to the minimal value of the frequency-temperature characteristic of the quartz-crystal element. Accordingly, the oscillation frequency varies from a frequency at the room temperature to another frequency at the minimal point based on the frequency-temperature characteristic and thereafter remains stably at the frequency at the minimal point. Usually, in order to cause the oscillation frequency to be stabilized rapidly after power supply is made available, the amplification factor A of operational amplifier 7 is set to a high value such as approximately 50 to 100, for example, so that the internal temperature of thermostatic oven 1 may rise rapidly.

In recent years, miniaturization of communication apparatus has been and is proceeding, and with the miniaturization, a quartz-crystal element of a reduced size is used popularly. Accordingly, also the heat capacity of the quartz-crystal element as thermostatic oven 1 decreases and the speed of the response of the internal temperature of the thermostatic oven to the power applied to heater 6 increases. Thus, when the internal temperature of the thermostatic oven approaches the preset temperature mentioned hereinabove after power supply is made available, a ringing phenomenon that the internal temperature of the thermostatic oven repeats a rise (overshoot) and a drop (undershoot) across the preset temperature occurs as shown in FIG. 6. Once a ringing phenomenon occurs, the time required for stabilization of the oscillation frequency increases, and this increases a substantial rise time. In an extreme case, a ringing phenomenon so continues as to cause a failure of equipment. This ringing phenomenon sometimes occurs not only when power supply is made available but also when the power supply increases or decreases due to a variation of the ambient temperature, for example, during operation because of an oversensitive reaction of the internal temperature of the oven, and this sometimes varies the oscillation frequency suddenly.

A possible solution to the problem described above is to set the amplification factor A of operational amplifier 7 to a lower value to decrease the power supply to heater 6 to prevent the ringing. However, the method of decreasing the amplification factor A gives rise to increase of the time required until the internal temperature of the thermostatic oven rises up to the preset temperature. Therefore, the method cannot be applied actually.

DISCLOSURE OF THE INVENTION

It is an object of the present invention to provide an oven-controlled oscillator wherein the internal temperature of a thermostatic oven rises rapidly up to a preset temperature while a ringing phenomenon is prevented and the oscillator exhibits a good rise after power supply is made available.

The object described above is achieved by a heat source control circuit (2) for controlling power to be supplied to a heater (6) serving as a heat source of a thermostatic oven (1), wherein a thermistor (RT2) is connected in series to a feedback resistor (Rb1) for an operational amplifier (7) and thermally coupled to the thermostatic oven (1).

In the present invention, the thermistor (RT2) whose resistance value varies in response to the internal temperature of the thermostatic oven is inserted in the feedback resistor for the operational amplifier. Therefore, when the internal temperature of the thermostatic oven is equal to or around the room temperature, the resistance value of the thermistor (RT2) is high and the amplification factor of the operational amplifier is high. On the other hand, in the proximity of the preset temperature on the high temperature side, the resistance value of the thermistor (RT2) is low and the amplification factor is low. Accordingly, in the proximity of the room temperature, high power is supplied to the heat source and the internal temperature of the thermostatic oven rises rapidly. Since the amplification factor decreases as the internal temperature of the thermostatic oven approaches the preset temperature, also the power supply to the heat source decreases, and consequently, the internal temperature of the thermostatic oven rises moderately up to the preset temperature. An excessive overshoot after the internal temperature of the thermostatic oven reaches the preset temperature is prevented. Furthermore, even if the ambient temperature varies after the preset temperature is reached, the heat source is prevented from reacting excessively sensitively and the internal temperature of the thermostatic oven is maintained constantly. In this manner, according to the present invention, an oscillator can be provided wherein the internal temperature of a thermostatic oven rises rapidly up to a preset temperature while a ringing phenomenon is prevented and the oscillator exhibits a good rise characteristic after power supply is made available and besides the oscillation frequency is stable.

DESCRIPTION OF THE PREFERRED EMBODIMENTS OF THE INVENTION

Next, preferred embodiments of the present invention will be described with reference to the drawings.

Figure 7:
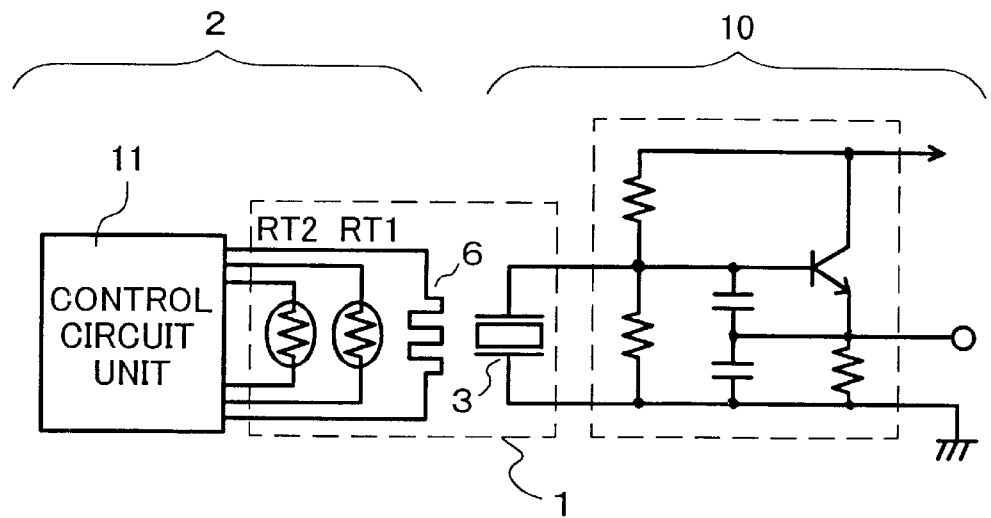
FIG. 7 is a view showing a general circuit configuration of an oven-controlled oscillator of a preferred embodiment of the present invention.
Figure 8:
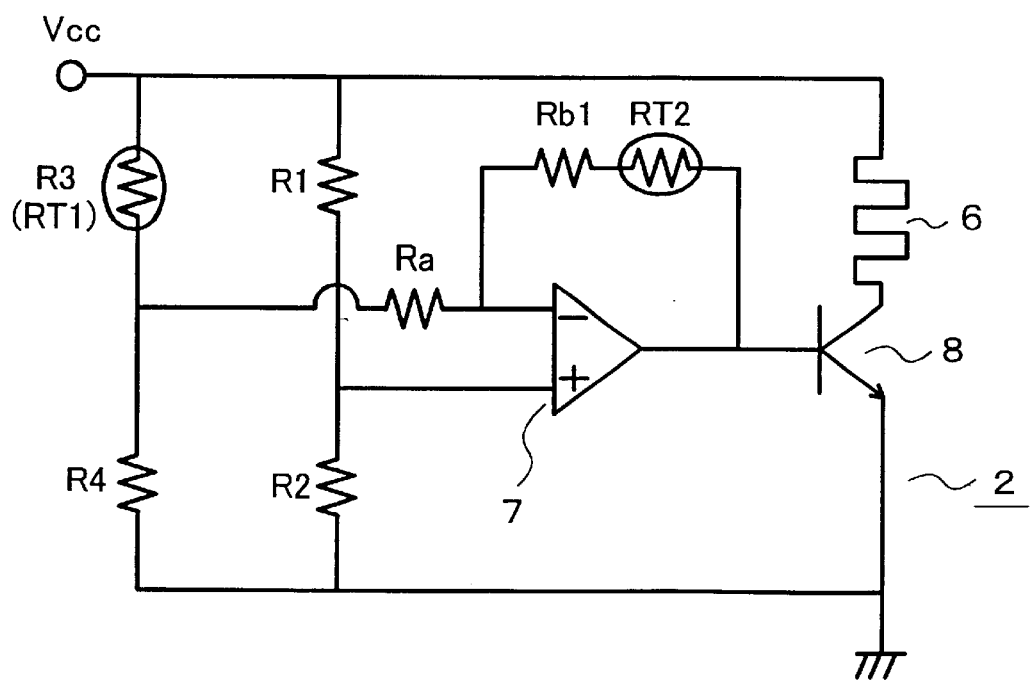
FIG. 8 is a circuit diagram showing a configuration of a heat source control circuit for the oven-controlled oscillator shown in FIG. 7.

An oven-controlled oscillator of a preferred embodiment of the present invention shown in FIG. 7 has a similar configuration to that of the conventional oven-controlled oscillator shown in FIGS. 1 to 4 and includes crystal oscillation circuit 10 of a Colpitts type circuit configuration, thermostatic oven 1 in which quartz-crystal element 3 is accommodated, heater 6 for heating the inside of thermostatic oven 1, and heat source control circuit 2 for controlling current to flow through heater 6. The oven-controlled oscillator of the present embodiment, however, is different from the conventional oven-controlled oscillator in that heat source control circuit 2 has a different circuit configuration. FIG. 8 shows the circuit configuration of heat source control circuit 2 in the oven-controlled oscillator of the present embodiment. In FIGS. 7 and 8, the same components to those shown in FIGS. 1 to 4 are denoted by the same reference numerals, and duplicated description of the components is omitted herein.

Figure 1:
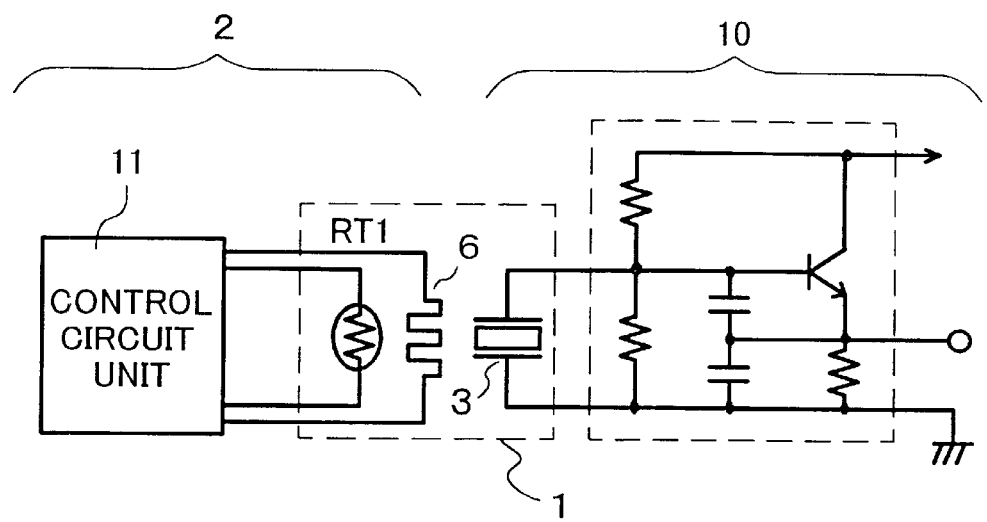
FIG. 1 is a view showing a general circuit configuration of a conventional oven-controlled oscillator.
Figure 2:
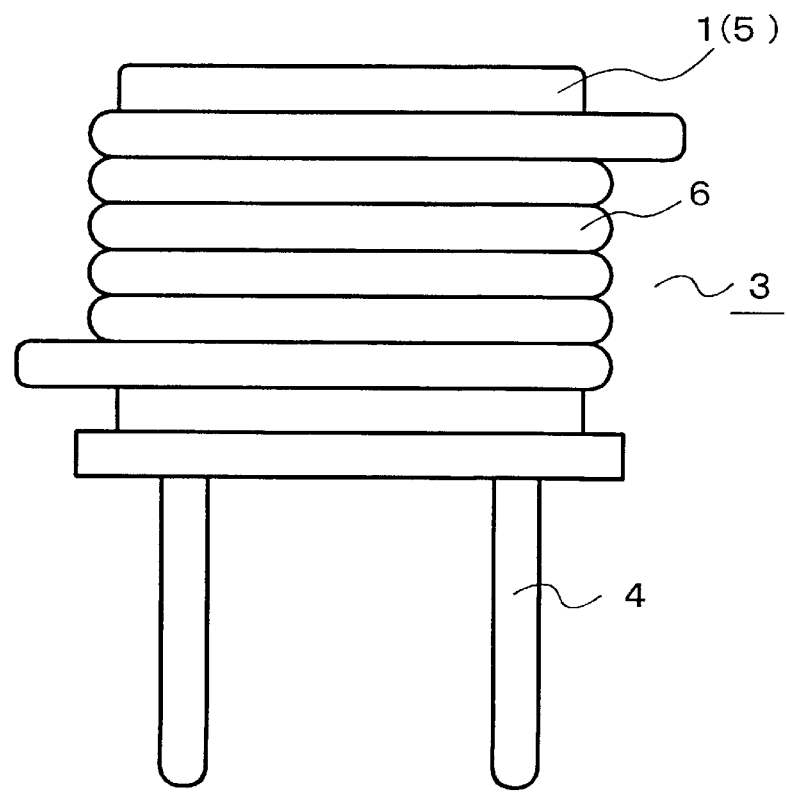
FIG. 2 is a front view of a quartz-crystal element wherein a metal vessel is used as a thermostatic oven.
Figure 3:
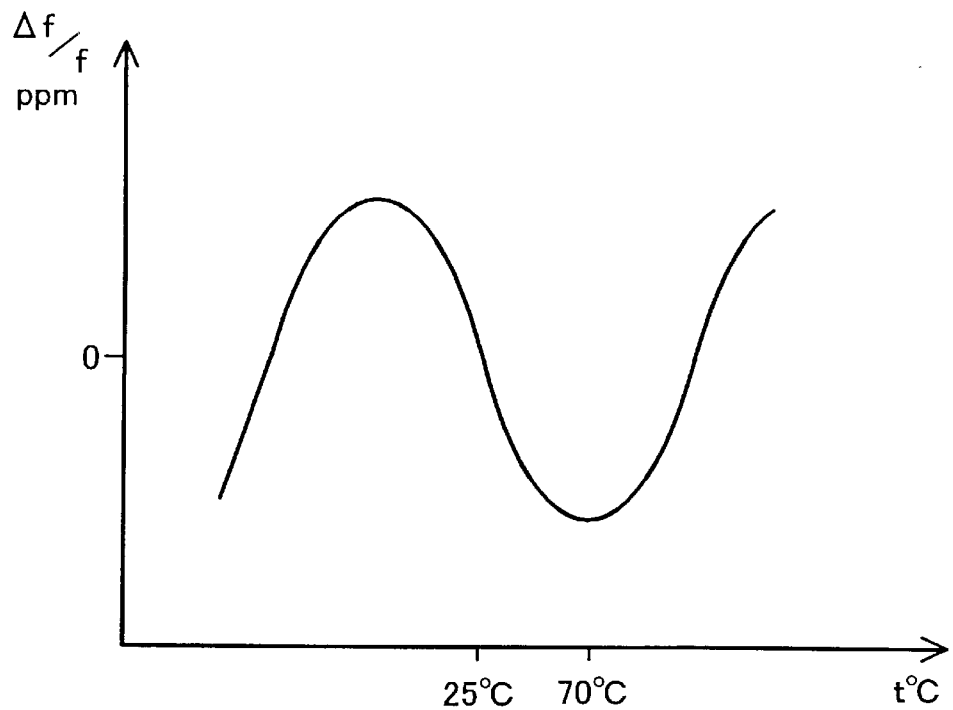
FIG. 3 is a graph illustrating a frequency-temperature characteristic of a quartz-crystal element which uses an AT cut quartz blank.

Thermostatic oven 1 is formed from heater wire 6 wound around metal vessel 5 for a quartz-crystal element similarly as in the thermostatic oven shown in FIGS. 1 and 2. Two thermistors RT1, RT2 which belong to heat source control circuit 2 are thermally coupled to thermostatic oven 1, and the resistance values of thermistors RT1, RT2 vary in response to the internal temperature of thermostatic oven 1. Various methods can be adopted to couple thermistors RT1, RT2 to thermostatic oven 1 including, for example, to dispose thermistors RT1, RT2 in the proximity of heater wire 6, to adhere thermistors RT1, RT2 to the surface of metal vessel 5, to provide thermistors RT1, RT2 in the inside of metal vessel 5, and where thermostatic oven 1 is surrounded by a heat insulator or an adiabatic material, to dispose thermistors RT1, RT2 in the inside of thermostatic oven 1.

Figure 4:
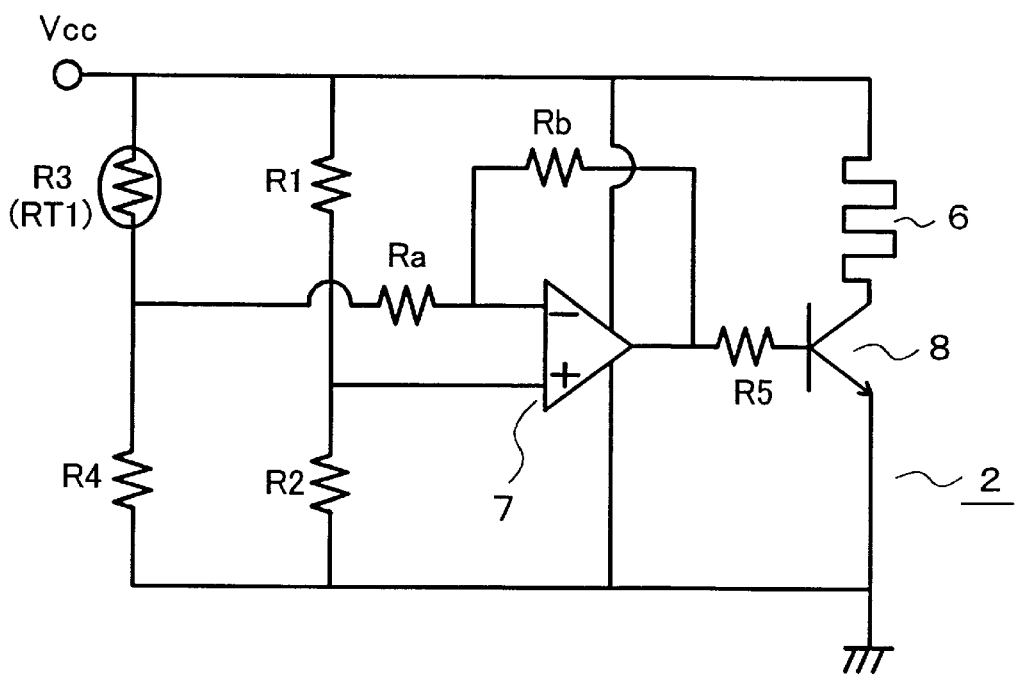
FIG. 4 is a circuit diagram showing an example of configuration of a conventional heat source control circuit.
Figure 5:
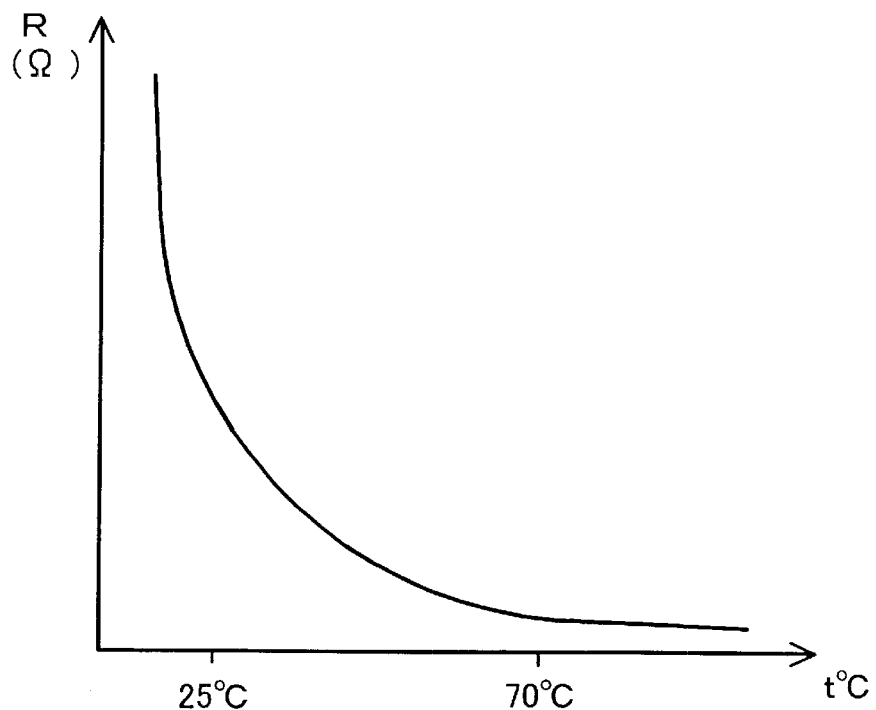
FIG. 5 is a graph illustrating a variation of the resistance of a thermistor with respect to the temperature.
Figure 6:
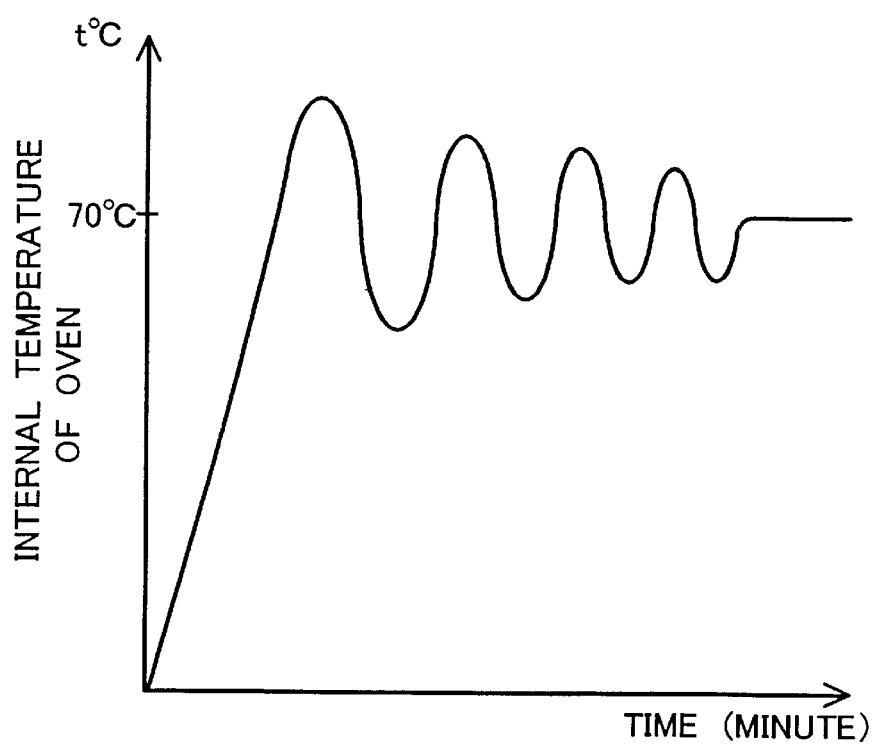
FIG. 6 is a graph illustrating a time variation of the internal temperature of a thermostatic oven of the conventional oven-controlled oscillator.

Heat source control circuit 2 in the present embodiment includes, similarly to the conventional heat source control circuit shown in FIG. 4, dividing bias resistors R1, R2 for generating a reference voltage, resistors R3, R4 for generating a comparison voltage, operational amplifier 7, transistor 8 provided on the output side of operational amplifier 7, a feedback resister interposed between the output and the inverted input terminal (−) of operational amplifier 7, and resistor Ra connected to the inverted input terminal of operational amplifier 7. Resistor R3 actually is thermistor RT1 for the temperature detection. The circuit shown in FIG. 8 is different from the circuit shown in FIG. 4 in that the feedback resistor for operational amplifier 7 is composed of pure resistor Rb1 and aforementioned thermistor RT2 connected in series. The resistance value of resistor Rb1 is lower than the resistance value of resistor Rb of the circuit shown in FIG. 4. For thermistor RT2, a thermistor whose resistance value drops as the temperature rises is used. The sum of the resistance values of resistor Rb1 and thermistor RT2 at the room temperature is substantially equal to that of resistor Rb of the circuit shown in FIG. 4.

Since such a circuit configuration as described above is adopted, the composite feedback resistance (Rb1+RT2) of operational amplifier 7 is high at the room temperature and decreases as the temperature rises. Accordingly, the amplification factor $A[=(Rb1+RT2)/Ra]$ of operational amplifier 7 is high at the room temperature and decreases as the temperature rises. Then at the preset temperature (approximately 70° C.) of thermostatic oven 1 set in the proximity of the minimal value of the frequency-temperature characteristic of quartz-crystal element 3, the resistance value of thermistor RT2 is so low that the resistance value of the feedback resistor for operational amplifier 7 is substantially equal to the resistance value of resistor Rb1.

After all, with the present circuit, when power supply is made available while the internal temperature of thermostatic oven 1 is substantially equal to the room temperature, the difference voltage between the reference voltage and the comparison voltage is amplified in accordance with a high value of the amplification factor A, and consequently, heater 6 provided on the collector side of transistor 8 generates a great amount of heat. In other words, when power supply is made available, the internal temperature of thermostatic oven 1 rises rapidly similarly as with the conventional oven-controlled oscillator shown in FIGS. 1 to 4. As the internal temperature of thermostatic oven 1 rises, the difference voltage decreases and also the resistance value of thermistor RT2 decreases, and consequently, the amplification factor A of operational amplifier 7 decreases. As the internal temperature of thermostatic oven 1 approaches the preset temperature, also the generated heat amount of the heater decreases when compared with an alternative case wherein the conventional heat source control circuit is used.

Figure 9:
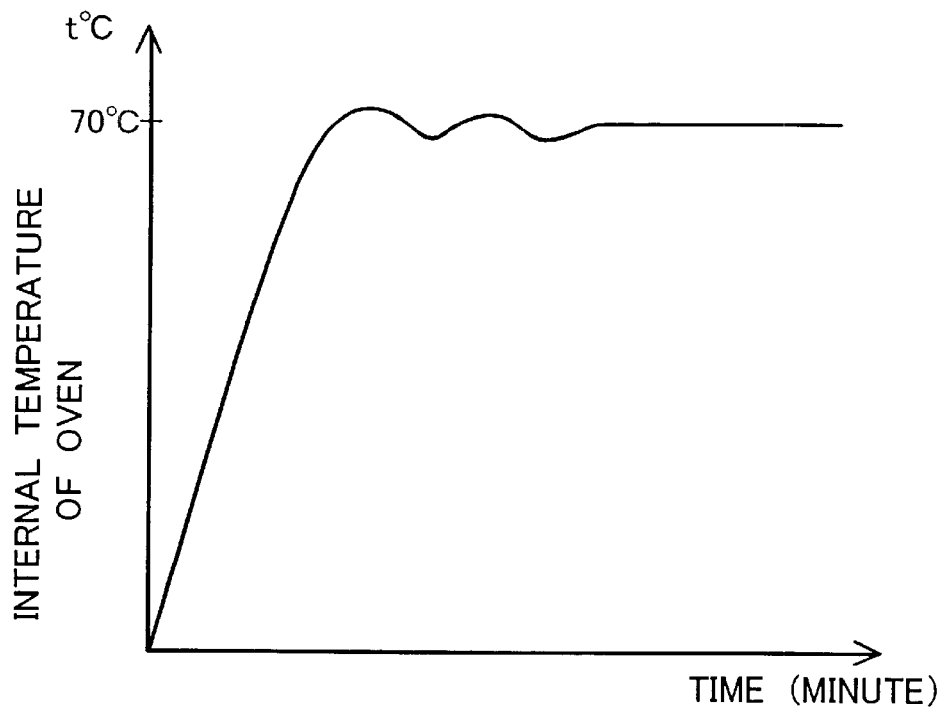
FIG. 9 is a graph illustrating a time variation of the internal temperature of the thermostatic oven of the oven-controlled oscillator shown in FIG. 7.

From the foregoing, where heat source control circuit 2 shown in FIG. 8 is used, the internal temperature of thermostatic oven 1 rises and approaches the preset temperature rapidly when power supply is made available, and thereafter approaches the preset temperature moderately until it reaches the preset temperature as seen from FIG. 9. Also overshoots and undershoots in this instance are small and also the amplitude of ringing is small, and the internal temperature of thermostatic oven 1 is maintained stably. The oscillation frequency of the crystal oscillation circuit rises rapidly and becomes stabilized quickly following the internal temperature of thermostatic oven 1. Even if the ambient temperature varies during operation of the oscillator after the preset temperature is reached in this manner, heat source control circuit 2 follows up the variation moderately and smoothly. Consequently, the oscillation frequency is maintained stably.

Figure 10:
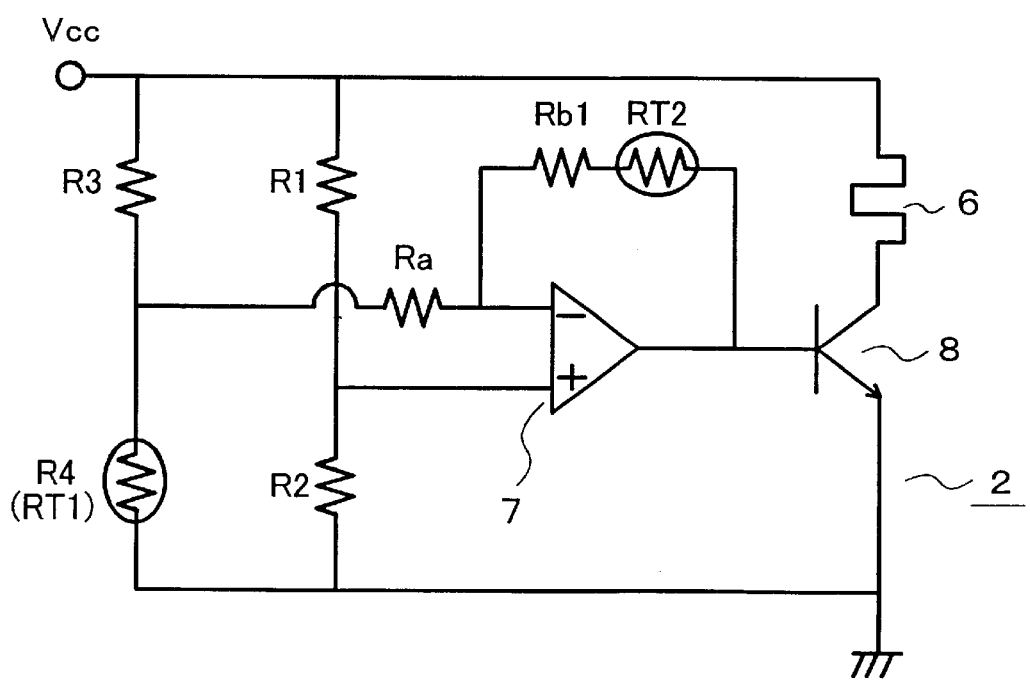
FIG. 10 is a circuit diagram showing a configuration of a heat source control circuit for an oven-controlled oscillator of another embodiment of the present invention.

Although operational amplifier 7 in the circuit shown in FIG. 8 operates as a differential amplifier of the inverted type, the configuration of the heat source control circuit in the present invention is not limited to the specific form. In heat source control circuit 2, operational amplifier 7 may operate as a differential amplifier of the non-inverted type as shown in FIG. 10, for example. In the circuit shown in FIG. 10, the reference voltage obtained from dividing bias resistors R1, R2 is supplied to the inverted input terminal of operational amplifier 7 through resistor Ra while the comparison voltage obtained by dividing bias resistors R3, R4 is supplied directly to the non-inverted input terminal of operational amplifier 7. In this instance, of dividing bias resistors R3, R4, resistor R3 on power supply Vcc side is formed from a pure resistor while resistor R4 on the ground side is formed from thermistor RT1. The circuit shown in FIG. 10 is similar in the remaining configuration to the circuit shown in FIG. 8.

Also in the present circuit, the amplification factor is high when power supply is made available, but as the internal temperature of thermostatic oven 1 rises, the amplification factor decreases. Accordingly, where the circuit shown in FIG. 10 is used, the internal temperature of thermostatic oven 1 rises rapidly up to the preset temperature. Further, the amplitude of ringing after the preset temperature is reached is small, and the internal temperature of thermostatic oven 1 can be maintained stably. It is to be noted, however, that the amplification factor A of operational amplifier 7 in the circuit of FIG. 10 is represented by $A=1+[(Rb1+RT2)/Ra]$.

While, in the foregoing description, heater wire 6 serving as a heat source is wound around metal vessel 5 of quartz-crystal element 3 to form thermostatic oven 1, the form of the thermostatic oven is not limited to the specific one. A thermostatic oven of the type wherein quartz-crystal element 3 is inserted in a metal tube, in which a heat source (heater 6) is provided, for example, may be used. A thermostatic oven of any type can be used only if it is configured so that it can maintain a quartz blank of a quartz-crystal element at a constant temperature. Furthermore, thermostatic oven 1 may accommodate not only the quartz-crystal element but also the entirety or part of the oscillation circuit.

While the present invention has been described with a quartz-crystal oscillator taken as an example, it can be applied also to an LC oscillator or the like, for example. Where the present invention is applied to an LC oscillator, an inductor (L) and a capacitor (C) by which the oscillation frequency is decided are accommodated in the thermostatic oven. Furthermore, while a heater wire is used as the heat source, alternatively a ceramic heater or the like may be used.

What is claimed is:

1. An oven-controlled oscillator comprising:
   a thermostatic oven having a heat source;
   a vibrator provided in said thermostatic oven;
   an oscillation circuit for generating an oscillation signal in response to an action of said vibrator; and
   a heat source control circuit including a sensor for detecting an internal temperature of said thermostatic oven, an operational amplifier for controlling current to flow through said heat source in response to a resistance value of said sensor so that the internal temperature of said thermostatic oven may be maintained at a predetermined preset temperature, and a feedback resistor for said operational amplifier;
   said feedback resistor including a thermistor whose resistance value drops as the temperature rises;
   said thermistor being thermally coupled to said thermostatic oven.

2. An oven-controlled oscillator according to claim 1, wherein said vibrator is a quartz-crystal element.

3. An oven-controlled oscillator according to claim 2, wherein said quartz-crystal element includes a quartz blank and a metal vessel for enclosing and holding said quartz blank, and said heat source is a heater wire which is wound around an outer wall of said metal vessel to form said thermostatic oven.

4. An oven-controlled oscillator according to claim 2, wherein said quartz-crystal element includes an AT cut quartz blank, and the preset temperature is set in a proximity of a minimal value of a frequency-temperature characteristic of said AT cut quartz blank.

5. An oven-controlled oscillator according to claim 1, wherein said operational amplifier operates as a differential amplifier of an inverted type.

6. An oven-controlled oscillator according to claim 1, wherein said operational amplifier operates as a differential amplifier of a non-inverted type.

7. A heat source control circuit for controlling a thermostatic oven which includes a heat source and maintains a quartz-crystal element at a constant temperature, comprising:
   a sensor for detecting an internal temperature of said thermostatic oven;
   an operational amplifier for controlling current to flow through said heat source in response to a resistance value of said sensor;
   and a feedback resistor for said operational amplifier;
   said feedback resistor including a thermistor whose resistance value drops as the temperature rises, said thermistor being thermally coupled to said thermostatic oven.

8. A heat source control circuit according to claim 7, wherein said operational amplifier operates as a differential amplifier of an inverted type.

9. A heat source control circuit according to claim 7, wherein said operational amplifier operates as a differential amplifier of a non-inverted type.

* * * * *